United States Patent [19]

Nunogawa et al.

[11] Patent Number: 5,142,171
[45] Date of Patent: Aug. 25, 1992

[54] INTEGRATED CIRCUIT FOR HIGH SIDE DRIVING OF AN INDUCTIVE LOAD

[75] Inventors: Yasuhiro Nunogawa, Takasaki; Hirotaka Mochizuki, Fujioka, both of Japan

[73] Assignees: Hitachi, Ltd.; Hitachi Microcomputer Engineeering Ltd., both of Tokyo, Japan

[21] Appl. No.: 681,417

[22] Filed: Apr. 4, 1991

Related U.S. Application Data

[63] Continuation of Ser. No. 331,950, Apr. 3, 1989, abandoned.

[30] Foreign Application Priority Data

Apr. 5, 1988 [JP] Japan .................................. 63-83700

[51] Int. Cl.⁵ .............................................. H03K 5/08
[52] U.S. Cl. ..................................... 307/565; 307/566; 307/559; 307/270; 307/303; 307/551; 361/91
[58] Field of Search ............... 307/270, 551, 561, 565, 307/522, 300, 318, 303, 443, 296.4, 566, 317.1; 323/229, 230, 231; 361/91, 56

[56] References Cited

U.S. PATENT DOCUMENTS

| | | | |
|---|---|---|---|
| 3,641,407 | 2/1972 | Scott | 307/566 |
| 3,770,986 | 11/1973 | Drehle | 307/318 |
| 4,322,770 | 3/1982 | Sendelweck | 307/303 |
| 4,549,095 | 10/1985 | Stefani et al. | 307/300 |
| 4,626,715 | 12/1986 | Ishii | 307/561 |
| 4,653,084 | 3/1987 | Ahuja | 307/632 |

OTHER PUBLICATIONS

Ferrier, "Compensation for Power Supply Variation", IBM Tech. Disclosure, vol. 8, No. 2, Jul. 1965, p. 267.

Primary Examiner—Timothy P. Callahan
Attorney, Agent, or Firm—Fay, Sharpe, Beall, Fagan, Minnich & McKee

[57] ABSTRACT

A semiconductor integrated circuit device is supplied with internal circuit operating voltage and/or internal circuit ground potential from the outside through a unidirectional element, and the device is provided with a unidirectional element disposed so as to pass current flowing from a circuit internal ground potential point toward an input and/or output terminal and/or a unidirectional element disposed so as to pass a current flowing from the input and/or output terminal toward an internal circuit operating voltage point. According to the above, signals supplied to the input and/or output terminal can be enlarged without being restricted by the level of the internal circuit operating voltage and/or the internal circuit ground potential by virtue of the switching function of the unidirectional elements.

55 Claims, 5 Drawing Sheets

INTEGRATED CIRCUIT FOR HIGH SIDE DRIVING OF AN INDUCTIVE LOAD

This application is a continuation of application Ser. No. 331,950, filed Apr. 3, 1989, now abandoned.

BACKGROUND OF THE INVENTION

The present invention relates to a semiconductor integrated circuit and, more particularly, to a technique effectively applied, for example, to an output circuit designed to drive an automotive inductive load by the use of an output MOSFET in the form of a source follower.

One example of power output circuits for driving inductive loads is disclosed in a magazine entitled Electronic Technology, November 1987, pp. 22–25. This power MOSFET is constructed such that the source is grounded and the drain is connected with an inductive load such as a motor or the like. This is known as a low side power switch.

Power output circuits for use in automobiles, e.g., those used for solenoids employed for electronic fuel injection, are preferably arranged as a high side switch with a power output switch element connected to the power supply voltage side, while a load is connected to the circuit ground potential side. This is because, if a load is connected to the power supply voltage side, when the load is grounded due to a collision or the like, an overcurrent may flow through the load to lead to a fire.

There is a trend to reduce the physical size of devices, such as the MOSFET, which decreases the threshold voltage, which, in turn, increases turn-off time.

SUMMARY OF THE INVENTION

As a part of the present invention, it is important to analyze problems in such circuits.

In a source follower, high side switch circuit such as that shown in FIG. 9, output MOSFET Q1 can be changed from the on-state to the off-state by turning on driving MOSFET Q2 (input signal of FIG. 10 going high) and bringing the gate of the output MOSFET Q1 to a low level, such as a circuit ground potential. However, since counter electromotive force is generated in load L in switching to the off state, the source potential of the output MOSFET Q1 becomes negative with respect to the gate of Q1. When this negative potential reaches the substantial threshold voltage Vth of the output MOSFET Q1, the MOSFET Q1 turns on again, thus clamping the Vth potential at the output terminal OUT, as shown in FIG. 10. Here it should be noted that the turn-off time T of Q1, for example, is inversely proportional to the absolute value of the magnitude of the drop in the output voltage below zero. Since the absolute value of the threshold voltage Vth is relatively small, a great deal of time is needed to release the energy stored in the load L, so that the time T required for the output MOSFET to be practically switched to the off-state is lengthened by the time T. This involves the problem that, when the load L is driven by means of a pulse-duration modulation signal, if time needed to reach the off-state is lengthened by the above-described counter electromotive force period T, the pulse-width duty of the pulse-duration modulation signal is restricted and the controllable range is narrowed correspondingly.

In addition to the output circuit of the type described above, an input circuit that comprises a PNP transistor T1, such as that shown in FIG. 11, also has a problem. When an input signal supplied to input terminal IN becomes a negative voltage, diode D3 present on the ground side of the structure of the PNP type of transistor comes into the on-state to clamp the negative input signal and, at the same time, the current that flows at that time may cause a malfunction of the internal circuit. For example, a signal formed by a fly-back transformer in a television receiving circuit becomes a negative voltage; therefore, employment of an input circuit of the type described above may cause a malfunction.

In the conventional semiconductor integrated circuit devices, the operating voltage and ground potential of the circuit are primarily determined by a low-impedance power supply provided either outside or inside the circuit and therefore, when the voltage becomes higher than the operating voltage or lower than the circuit ground potential as viewed from the input or output terminal, the operation is not guaranteed.

It is an object of the present invention to provide a semiconductor integrated circuit device designed so that it is possible to reliability enlarge the dynamic range of a signal as viewed from an input and/or output terminal.

The following is a brief summary of a typical one of the inventions disclosed in the present application. Namely, a semiconductor integrated circuit device is supplied with internal circuit operating voltage and/or a internal circuit ground potential from the outside through a unidirectional element, and the device is provided with a unidirectional element disposed so as to pass current flowing from a circuit internal ground potential point toward an input and/or output terminal and/or a unidirectional element disposed so as to pass a current flowing from the input and/or output terminal toward an internal circuit operating voltage point.

According to the above, signals supplied to the input and/or output terminal can be enlarged without being restricted by the level of the internal circuit operating voltage and/or the internal circuit ground potential by virtue of the switching function of the unidirectional elements.

It is also an object to decrease the switching time of devices such as the MOSFET, by using external energy, for example, from an inductive load, as a result of the increased output range. Currently, smart type (with active internal circuits) MOSFET power switches are not used in many applications because they are too slow.

It is a further object to provide a reliable high side IC power switch. It is particularly desirable to maintain the system ground and isolation layer in such a device at the lower circuit potential to prevent parasitic effects.

BRIEF DESCRIPTION OF THE DRAWINGS

The above and other objects and novel features of the present invention will become apparent from the following description taken in conjunction with the accompanying drawings.

DETAILED DESCRIPTION OF PREFERRED EMBODIMENTS

Figure 1:
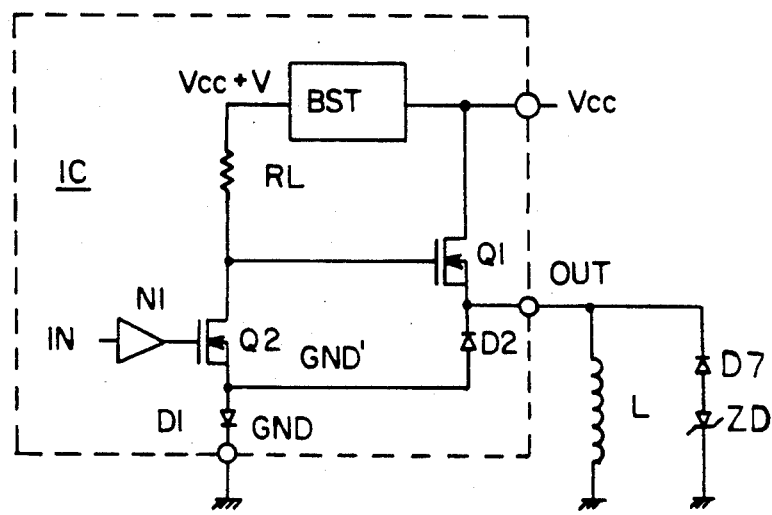
FIG. 1 is a circuit diagram showing a portion of one embodiment of the present invention.

FIG. 1 is a circuit diagram of one embodiment in which a power output circuit according to the present invention is used to constitute a high-side power switching or load driving circuit (source follower circuit) for driving an inductive load L, such as a motor or a solenoid.

The power output circuit in this embodiment is fabricated in the form of a single integrated circuit IC, as shown by the chain line in the figure. A power MOSFET Q1 is arranged such that the substrate is employed to constitute the drain electrode on the reverse side of the substrate, as will be explained later with respect to FIG. 7 and 8.

The drain of the power MOSFET Q1 is coupled to a power supply voltage Vcc. The source of the power MOSFET Q1 is coupled to an external terminal OUT to which is connected an inductive load L, such as a motor or a solenoid. Therefore, the power MOSFET Q1 operates as a source follower output MOSFET.

The gate of the power MOSFET Q1 is connected with a driving circuit that comprises a driving MOSFET Q2 and a load resistor RL. The operating voltage of the driving circuit is a voltage Vcc+V obtained by boosting the power supply voltage Vcc by a booster circuit BST that adds voltage V. The gate of the driving MOSFET Q2 is supplied with a control signal IN through an inverter circuit N1. The operating voltage of the inverter circuit N1 is set lower than the above-described power supply voltage Vcc, e.g., Vcc is 12 V and V IN is 5 V, preferably positive voltages. The high level of the control signal IN is set at 5 V to connect the load L to power Vcc, while the low level is set to a relatively low logic level, e.g., a ground potential of the circuit to disconnect the load L from the power source Vcc. Accordingly, the power MOSFET driving circuit that comprises the inverter circuit N1, the MOSFET Q2 and the resistor RL performs a kind of level inverting operation.

In this embodiment, the following arrangement is adopted in order to increase the practical switching speed at which the power MOSFET Q1 is practically switched to the off-state. Namely, an internal circuit ground potential GND', internal with respect to the IC, is supplied to the source of the driving MOSFET Q2 through diode D1. More specifically, the internal circuit ground potential GND' for the internal circuit of the IC is higher than the external ground potential GND by an amount corresponding to the forward voltage of the diode D1. This internal ground potential GND' is also employed as ground potential for the inverter circuit N1 and the booster circuit BST. Further, diode D2 is provided to pass current from the internal circuit ground potential GND' to the output terminal OUT in order to enlarge the dynamic range on the negative polarity side at the output terminal OUT, i.e., to prevent the output MOSFET Q1 from being brought into the on-state again by the counter electromotive force generated in the load L.

For example, when the control signal IN is at the high level to connect load L, the output signal from the inverter circuit N1 is at a low level, such as the circuit ground potential GND'. In response to the fall of the inverter circuit N1 output signal to the low level, the driving MOSFET Q2 is brought into the off-state, so that current no longer passes through RL to drop the supply voltage and therefore the gate of the power MOSFET Q1 is supplied with boosted operating voltage Vcc+V through the resistor RL. With Q2 now off, no current flows through RL and therefore RL drops no voltage. The boost voltage +V that is formed in the booster circuit BST is set so as to be equal to or higher than the substantial threshold value of the MOSFET Q1 so that Q1 will stay on when its source voltage is Vcc. Accordingly, when the MOSFET Q1 is in the on-state, the power supply voltage Vcc is the output from the source of the MOSFET Q1 and therefore it is possible to obtain a high output voltage Vcc without a voltage loss, as shown in the waveform chart of FIG. 2. In such a steady-state operating condition, the diode D2 is reverse-biased and therefore in the off-state, so that it is possible to obtain the above-described output signal Vcc at the OUT terminal.

Figure 2:
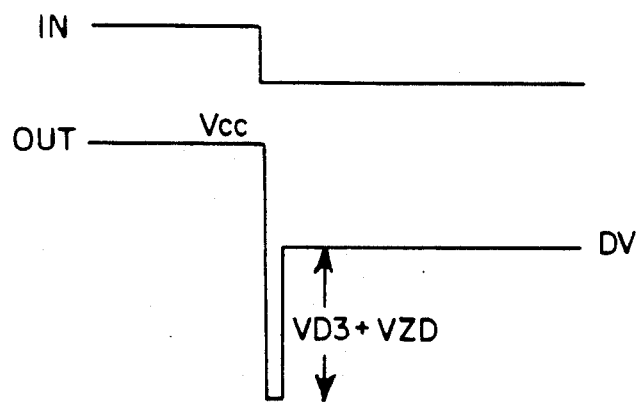
FIG. 2 is a waveform chart employed to describe the operation of the embodiment.

When the control signal IN is switched over from the high level to the low level, the output signal from the inverter circuit N1 is raised to a high level, thus bringing the driving MOSFET Q2 into the on-state dropping voltage across RL. In consequence, the gate and source of the power MOSFET Q1 are shorted through D2 and therefore the power MOSFET Q1 is switched over from the on-state to the off-state as shown in FIG. 2. At this time, counter electromotive force is generated in the load L, causing the output terminal OUT connected with the source of the power MOSFET Q1 to lower to a negative potential. The counter electromotive force causes the diode D2 to be brought to the on-state and also lowers the ground potential GND' inside the IC. Therefore, even if the above-described counter electromotive force is generated, because of D1 and Q2 being on, the gate voltage of Q1 follows the lowering of GND'. The MOSFET Q2 is maintained in the on-state by the high level of the output signal from the inverter circuit N1, so that the output MOSFET Q1 is left in the off-state. In other words, there is no fear of voltage at the output terminal OUT being clamped in the internal circuit, and the operation of the internal circuit is guaranteed.

In this embodiment, a voltage clamping circuit comprises a diode D7 and a zener diode ZD is provided for the load L. Accordingly, the potential at the output terminal OUT at the time when the output MOSFET Q1 is switched to the off-state is a high negative voltage, i.e., $-(VD3+VZD)$, as shown in the waveform chart of FIG. 2. VD3 is the forward voltage of the diode D7, while VZD is the zener voltage of the zener diode ZD. By setting the absolute value of the above-described clamp voltage at a high level, the energy stored in the inductive load L can be released within a short period of time. As noted above, the time T is inversely proportional to this voltage. Thus, it is possible to enlarge the controllable output signal range, particularly where MOSFET Q1 is controlled by a pulse modulation signal, FIG. 12. Thus the external energy of the inductive load is used to increase switching speed.

Figure 3:
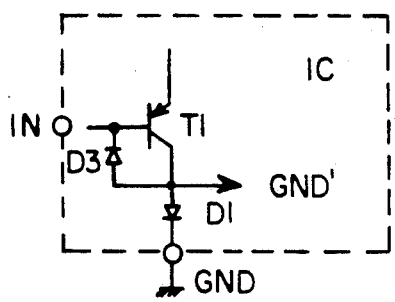
FIG. 3 is a circuit diagram showing another portion of the embodiment of the present invention.

FIG. 3 is a circuit diagram of another portion of the one embodiment applied to an input circuit that employs a PNP transistor as an active component of the internal circuit.

In this embodiment, an IC internal circuit is supplied with ground potential through diode D1. In order to enlarge the dynamic range on the negative polarity side at input terminal IN, a diode D3 is added to pass current from the internal ground potential GND' toward the input terminal IN. In this arrangement, when a signal supplied to the input terminal IN becomes negative in polarity, the diode D3 turns on to lower the internal ground potential GND' in accordance with the level of signal applied to the input terminal IN. Thus by a diode and the like provided in the internal circuit, it is possible to enlarge the input dynamic range of the input signal below the ground potential GND without a fear that the signal applied to the input terminal IN will be voltage-clamped. In this case, the ground potential GND' lowers in accordance with the lowering of the input signal and therefore the operation of the internal circuit is guaranteed.

Figure 4:
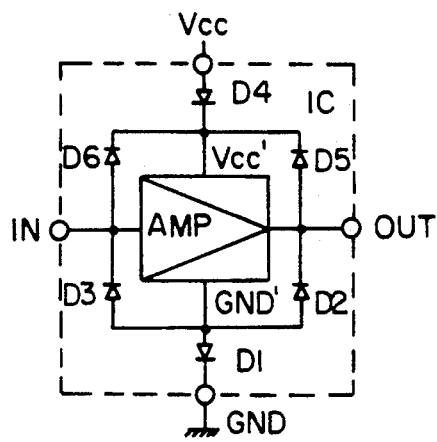
FIG. 4 is a block diagram of the embodiment that shows the general concept of the present invention.

FIG. 4 is a block diagram showing the general concept of the present invention, with the lower right hand quadrant corresponding to FIG. 1 and the lower left hand quadrant corresponding to FIG. 3.

This figure shows a general technique of enlarging the dynamic ranges of the input and output of an active internal circuit, for example, an amplifier circuit AMP, formed in a semiconductor integrated circuit, respectively on the negative polarity side below a ground potential and on the positive polarity side above a power supply voltage Vcc.

More specifically, a circuit internal ground potential GND' and an internal operating voltage Vcc' are supplied through respective diodes D1 and D4. Therefore, the level of the ground potential GND' is higher than of external ground potential GND by an amount corresponding to the forward voltage of the diode D1. The level of the internal operating voltage Vcc' is lower than external power supply voltage Vcc by an amount corresponding to the forward voltage of the diode D4. In order to enlarge the input dynamic range on the negative polarity side below the ground potential GND, a diode D3 is provided between the internal ground potential GND' and input terminal IN to pass current from GND' toward IN. In order to enlarge the output dynamic range on the negative polarity side, diode D2 is provided between the internal ground potential GND' and output terminal OUT to pass current from the GND' toward OUT.

On the other hand, in order to enlarge the input dynamic range on the positive polarity side above the power supply voltage Vcc, a diode D6 is provided between the input terminal IN and internal operating voltage Vcc' to pass current from the input terminal IN toward Vcc'. In order to enlarge the output dynamic range on the positive polarity side above the power supply voltage Vcc, a diode D5 is provided between the output terminal OUT and the operating voltage Vcc' to pass current from OUT toward Vcc.

In this arrangement, when the potential at the input terminal IN or the output terminal OUT becomes negative in polarity, the internal ground potential GND' is also lowered in response to the lowering in potential at the input terminal IN or the output terminal OUT by the function of the diode D3 or D2, respectively in cooperation with diode D1. Conversely, when the potential at the input terminal IN or the output terminal OUT becomes higher than the power supply voltage Vcc, the internal operating voltage Vcc' is raised in response to the rise in potential at the input terminal IN or the output terminal OUT by the function of the diode D6 or D5 respectively in cooperation with diode D4. Thus, in the active internal circuit, e.g., amplifier circuit AMP of this embodiment, when the potential at either the input terminal IN or the output terminal OUT exceeds the ground potential GND or the power supply voltage Vcc in terms of absolute value, the internal ground potential or the internal operating voltage changes in response to the change in potential at the input terminal IN or the output terminal OUT, respectively, and therefore it is possible to guarantee the operation of the internal circuit while enlarging the dynamic range of the input or output signals respectively.

Figure 5:
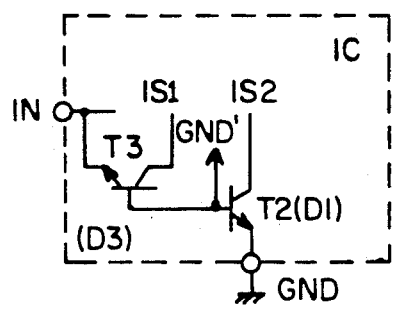
FIG. 5 is a circuit diagram of a variation of FIG. 3.

FIG. 5 is a circuit diagram of a variation of FIG. 3.

Referring to the figure, internal ground potential GND' for a semiconductor integrated circuit IC is supplied through the base and emitter of transistor T2 employed in place of or acting as the above-described diode D1. A transistor T3 is disposed between input terminal IN and internal ground potential GND' to utilize its base and emitter in place of or acting as the diode D3. In this arrangement, it is possible to detect a terminal that has the lowest potential by supplying the transistors T2 and T3, functioning as sense transistors, with collector currents IS2 and IS1 as sense currents, respectively. For example, when the collector current IS2 of the transistor T2 is flowing, the terminal that supplies the ground potential GND has the lowest potential, whereas, when the collector current IS1 of the transistor T3 is flowing, the input terminal IN has the lowest potential. If each terminal is provided with a transistor such as the transistor T3, it is possible to detect a terminal that has the lowest potential among a plurality of terminals. That is, in a like manner, transistors could also replace diodes D2, D5, D4, D6 in FIG. 4. This arrangement can also be utilized for feedback or the like, for example with internal logic for a smart type of MOSFET power switch.

Figure 6:
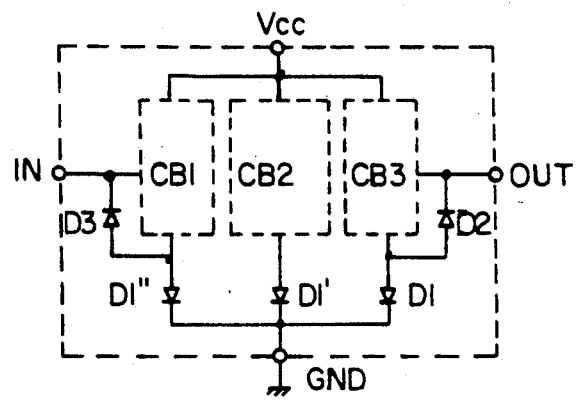
FIG. 6 is a block diagram showing a further embodiment of the present invention.

FIG. 6 is a block diagram of a further embodiment of the present invention.

In this embodiment, a circuit formed in a semiconductor integrated circuit IC is divided into a plurality of blocks CB1, CB2 and CB3. The circuit blocks CB1, CB2 and CB3 are supplied with ground potential from an external terminal through diodes D1'', D1' and D1, respectively. A diode D3 described above is provided between input terminal IN through which an input signal is supplied to the internal ground of circuit block CB1. A diode D2 described above is provided between an output terminal OUT through which an output signal is delivered from the internal ground potential of circuit block CB3. In this arrangement, when the input terminal IN is brought to a negative potential, the internal ground potential for the circuit block B1 corresponding thereto follows the change in potential at the input terminal IN, while the separate internal ground potentials for the other circuit blocks CB2 and CB3 can be supplied through the respective diodes D1' and D1. Therefore it is seen that the present invention is applicable to a plurality of separate internal ground potentials and similarly to a plurality of separate internal operating voltages. On the other hand, when the output terminal OUT is brought to a negative potential, the internal ground potential for the circuit block CB3 corresponding thereto follows the change in potential at the output terminal OUT, while the internal ground potentials for the other circuit blocks CB1 and CB2 can be supplied through the respective diodes D1" and D1'. It is possible with this arrangement to obtain a semiconductor integrated circuit having a circuit block CB2 independent of the level of the input voltage or output voltage while still employing the advantages of diodes D2 and D3 for circuit blocks CB3 and CB1.

Figure 7:
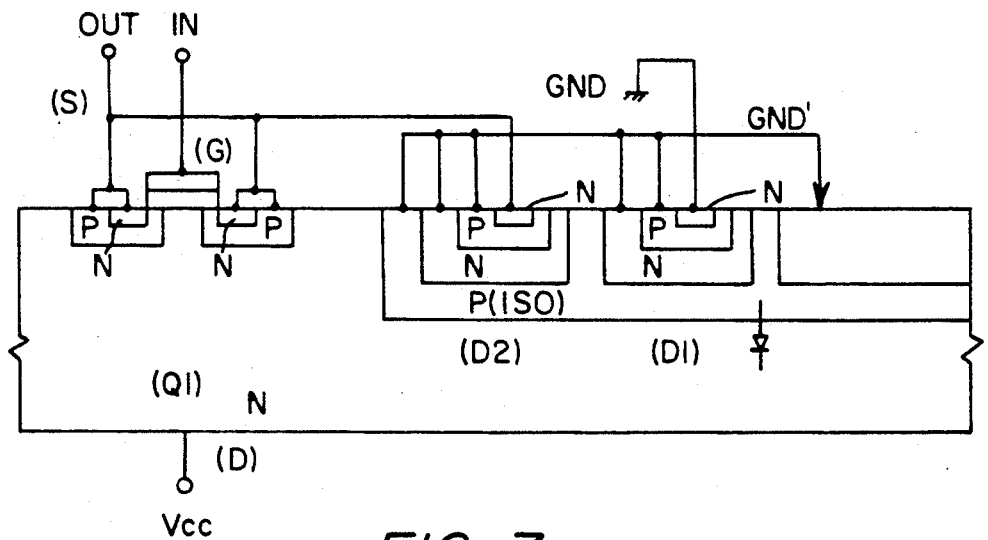
FIG. 7 is a sectional view showing the structure of one example of the circuit shown in FIG. 1.

FIG. 7 is a sectional view showing the structures of the MOSFET Q1 and diodes D1, D2 in the circuit according to the embodiment shown in FIG. 1.

The power MOSFET Q1 employs an N-type substrate as its drain region. Accordingly, a drain electrode D is provided on one side of the substrate. The drain electrode D is supplied with a power supply voltage Vcc. A P-type channel region of the power MOSFET Q1 is formed in a ring-like shape in the surface of the other side of the substrate opposite drain electrode D. A ring-shaped N-type source region is similarly formed in the surface of the P-type channel region. A gate electrode G is formed through a gate insulator on the surface of a channel region sandwiched between the source region and the substrate serving as the drain region. The source and channel regions are mutually connected to constitute a source electrode S. Thus, the driving current of the MOSFET Q1 flows vertically through the substrate.

The power MOSFET Q1 and the above-described other elements are formed on the same substrate. Therefore, a P-type isolation region (ISO) is formed in the N-type substrate and the above-described circuits are formed while being isolated from each other by the P-type isolation region ISO. For example, a transistor connected in the form of a diode is employed as the diode D1. More specifically, and N-type collector region is formed within the P-type isolation region ISO, while a P-type base region is formed within the collector region, and an N-type emitter region is formed within the base region, thereby constituting an NPN type transistor. The P-type region serving as the base and the N-type region serving as the collector are connected together to use the transistor as a diode. The N-type emitter region that functions as the cathode of the diode D1 is supplied with a circuit ground potential GND through an external terminal. The base and collector regions, which are mutually connected to function as the anode, are connected to a point to apply a bias voltage to the P-type isolation region ISO and to internal ground potential GND' of the circuit. The base and collector regions mutually connected to serve as the anode are further connected to the anode of the diode D2. The diode D2 is formed using a transistor having a structure similar to the above. More specifically, the base and collector of the transistor are mutually connected to constitute a diode D2 and are connected to the base and collector of the diode D1, which function in combination as the anode electrode. The emitter of the transistor that constitutes the diode D2 functions as the cathode electrode and is connected to the source S of the MOSFET Q1.

In this type of semiconductor structure, a large parasitic diode is present between the isolation region ISO and the substrate, as schematically shown as DP. However, even if the power supply voltage terminal Vcc and the circuit ground potential GND are reversly connected, that is, even if a ground potential is applied to the terminal Vcc and a voltage, i.e., +12 V, is applied to the terminal GND, no overcurrent that would destroy the elements flows through this parasitic diode DP since the diode D1 is inserted. Accordingly, the semiconductor integrated circuit device of this embodiment is suitable for a power switching circuit mounted on an automobile. This is because it often happens that, when it becomes impossible to start the engine of an automobile due to the battery being weak, the battery is connected with the battery mounted on another automobile to thereby start the engine, and, in such case, there is a strong possibility that the two batteries may be reversly connected through a cable. Even if such reverse connection is made, there is no fear of the elements being destroyed in the above-described semiconductor integrated circuit device.

Figure 8:
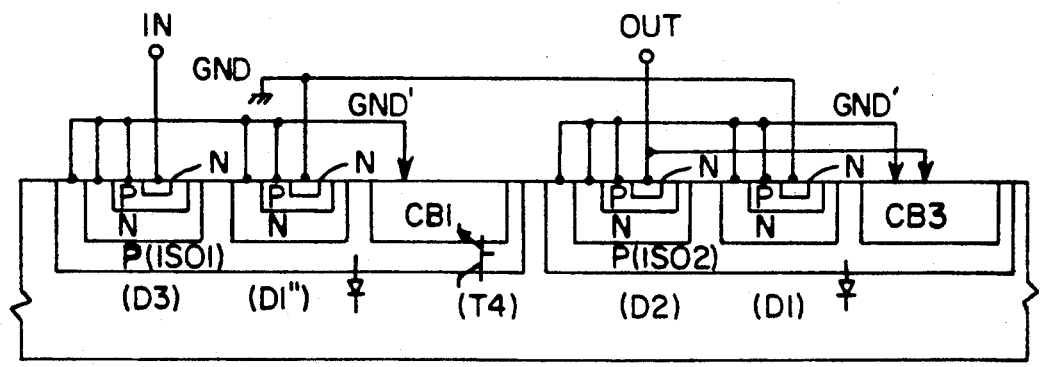
FIG. 8 is a sectional view corresponding to that shown in FIG. 6.
Figure 9:
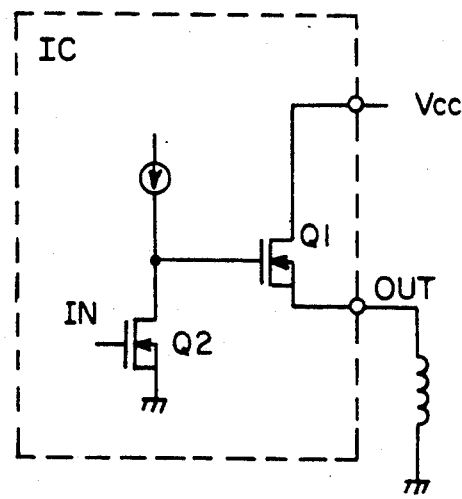
FIG. 9 is a circuit diagram showing one example of a source follower output circuit.
Figure 10:
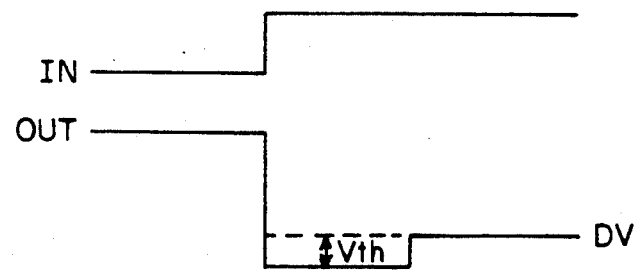
FIG. 10 is a waveform chart employed to describe the operation of the source follower output circuit shown in FIG. 9.
Figure 11:
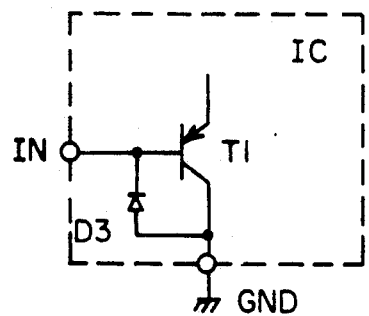
FIG. 11 is a circuit diagram employed to describe one example of an input circuit.

FIG. 8 is a sectional view showing a plurality of blocks provided in a semiconductor integrated circuit in the same way as in FIG. 6. More specifically, two isolation regions ISO1 and ISO2 are provided on a semiconductor substrate. For example, if the isolation region ISO1 is provided with an input terminal IN as in the case of the circuit block CB1 shown in FIG. 6, diodes D3 and D1" are formed by making use of the transistor structure in the same way as the diodes D2 and D1 for FIG. 7 above, thereby supplying an internal ground potential GND' and providing connection between the ground potential and the input terminal IN. If the other isolation region ISO2 is provided with an output terminal OUT as in the case of the circuit block CB3 shown in FIG. 6, diodes D1 and D2 having a similar structure are formed, thereby supplying the internal ground potential GND' and providing connection between the ground potential and the output terminal OUT.

The above-described isolation regions ISO2 and ISO1 are supplied with the internal ground potential GND' through the diodes D1 and D1", respectively. In this arrangement, the potential at the isolation regions ISO1 and ISO2 change in accordance with the lowest potentials at the terminals IN and OUT, respectively, and can be maintained at the lowest potential of the circuit. Accordingly, it is possible to prevent operation of a vertical parasitic transistor (T4) formed using the isolation region ISO1 (ISO 2) as its base. Since the power supply voltage Vcc is applied to the substrate, it is possible to prevent generation of a lateral parasitic transistor which uses the two isolation regions ISO1 and ISO2 as its emitter and collector, respectively, and the substrate therebetween as its base.

It should be noted that in an arrangement wherein the internal operating voltage is also supplied through a diode as in FIG. 6, the substrate is also supplied with the voltage through the diode.

Figure 12:
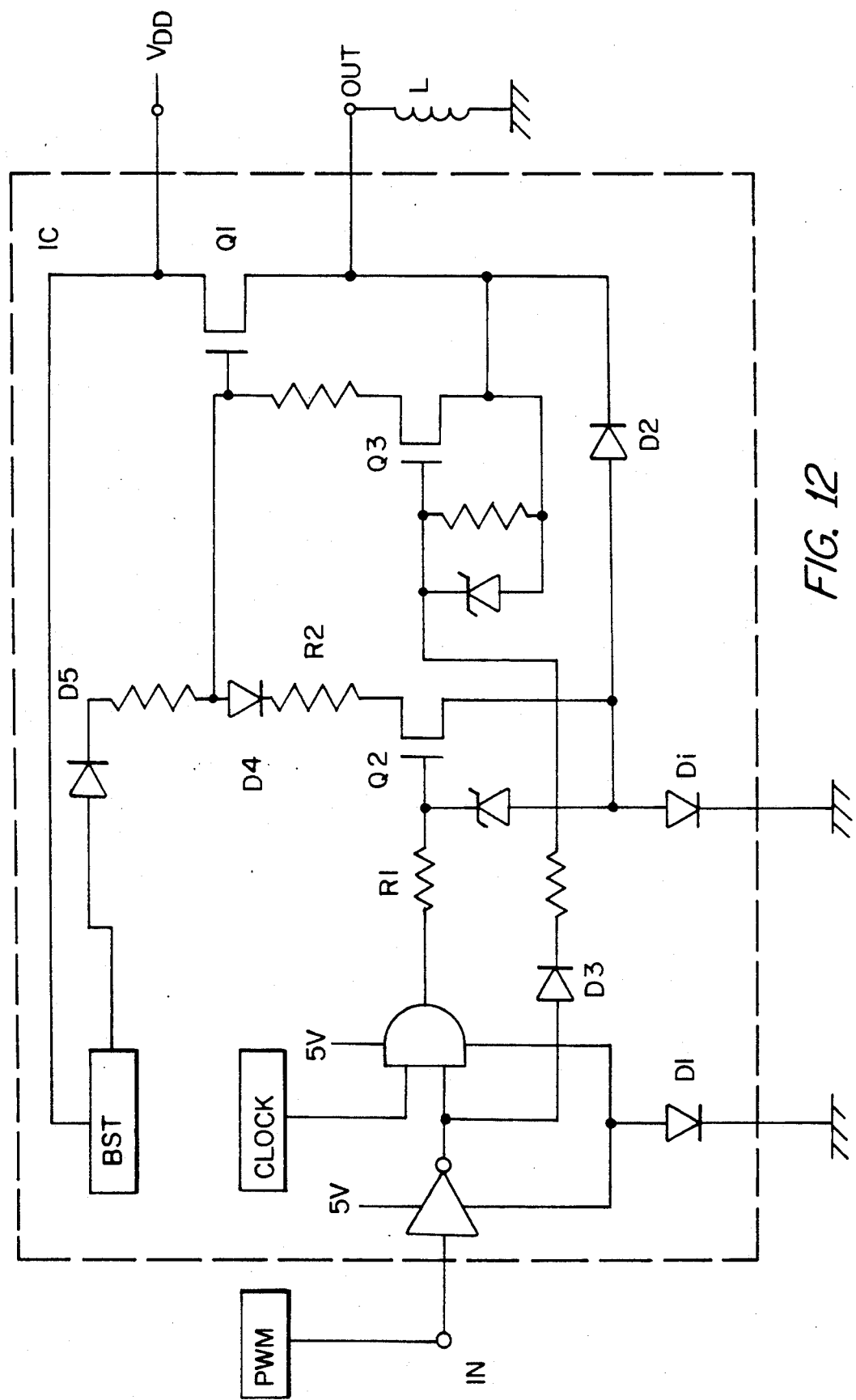
FIG. 12 is a circuit diagram of a portion of FIG. 6.

In FIG. 12, you cannot use a control voltage to turn on gate Q3 to directly turn off Q1 because the source voltage of Q1 is VDD or 12 volts and the control voltage to the gate of Q3 is only maximum 5 volts, this is so because the gate to source voltage of Q3 would be negative and impossible to turn on Q3. Therefore, you need Q2 to turn on first. A steep ramp in the turn off signal is undesirable because it would produce a lot of noise. Therefore, it is desirable to have a slope to the turn off signal. If the slope were provided by the resistor R1 together with the capacitance of Q2, the turn-off signal would drop off quickly and produce noise, which is bad, and then at the bottom of the slope it would drop off very slowly, which is also bad. Therefore, a square wave pulse is used to obtain the slope. The square wave pulse together with the resistor R1 and capacitance of Q2 will produce a stair step ramp as the slope. The slope of the stair step ramp may be changed by changing the duty cycle of the pulse output from the AND gate. However, there is stray capacitance between the gate to grain of Q2, which together with R2 will produce a feed of the pulse signal to the gate of Q1, which is undesirable. Therefore, the diode D4 is inserted to block the feed to the gate of Q1. When Q2 turns on it will start to drop the voltage on the gate of Q1 and start to turn Q1 off to lower the source voltage of Q1. Therefore, the source voltage of Q1 will finally get low enough so that the corresponding source voltage of Q3 will drop sufficiently below the 5 volt control voltage passing through D3 so that Q3 will turn on. When Q3 turns on, it will provide the required short between gate to source of Q1 to turn off Q1. The trouble with inserting the diode D4 is that now you have a diode voltage drop of D4 plus D2 when Q2 is turned on, which would be about 1.4 volts and close to Vth for gate to source of Q1. Therefore, you could not reliably turn off Q1 using only Q2. That's why you must also have Q3. The Zener diodes from gate to source for each of Q2 and Q3 are provided to prevent destruction respectively of Q2 and Q3. That is, if the inductive load going off were to pull the output voltage far below zero there could be excessive voltage from gate to source across Q3 and Q2. The breakdown voltage of the Zener diodes will prevent this.

The diode D3 is provided to prevent a high voltage at the output terminal, for example 12 volts, from feeding current from the output back to the input. The resistance across the Zener diode is provided to drain off gate voltage when Q3 is turned off, because otherwise the Zener diode Q2 or Zener diode of Q3 and the diode D3 would prevent voltage from dissipating.

The foregoing embodiments provide the following advantageous effects:

(1) A semiconductor integrated circuit device is supplied with an operating voltage and/or a circuit ground potential from the outside through a unidirectional element, and the device is provided with a unidirectional element disposed to pass current from an internal ground potential point toward an input and/or output terminal and/or a unidirectional element is disposed to pass current from the input and/or output terminal toward an internal operating voltage point, whereby signals applied to the input and/or output terminal can be enlarged by the switching function of the unidirectional elements without being restricted by the level of the internal operating voltage and/or the ground potential. For example, devices can be made with a negative side of the range of −15 to −20 with the present invention compared with a negative range side of the range of −5 to −6 for the same device without the present invention. Therefore, the switching speed with the present invention is three times faster than the prior devices using the external energy of an inductive load, for example.

(2) A semiconductor integrated circuit, which constitutes a high-side driving circuit, is supplied with an internal ground potential through a diode, and a diode is inserted between the internal ground potential and a source follower output terminal, whereby it is possible to reduce the time required for an output MOSFET to be practically brought into the off-state. Thus, it becomes possible to drive an inductive load by means of a pulse-duration modulation signal.

(3) By adopting an arrangement wherein a ground potential is supplied through a diode as in the foregoing arrangement (1) or (2), it is possible to improve the breaking strength in the case where the power supply is reversly connected.

(4) A circuit formed in a semiconductor integrated circuit is divided into a plurality of blocks each of which is supplied with either an internal ground potential or an internal operating voltage through a diode, and a diode is provided between a circuit block and an external terminal that exchanges signals therewith, whereby it is possible to determine a lowest potential lower than the ground potential and a highest potential higher than the operating voltage for each block in correspondence to the level of voltage applied to the external terminal. It is possible with this arrangement to obtain a semiconductor integrated circuit having a circuit block independent of the level of input voltage or output voltage.

Although the invention has been described specifically by way of the embodiments, it should be noted here that the present invention is not necessarily limited to the described embodiments and various changes and modifications may be imparted thereto without detracting from the gist of the invention. For example, in the embodiment shown in FIG. 4, it is possible to select one of various combinations of diodes D1 to D6 to be added in accordance with the level of voltage applied to the terminal IN or OUT. The arrangement may also be such that a plurality of power MOSFETs are provided on a single semiconductor substrate. In this case, in regard to power MOSFETs using the substrate as their drains, the arrangement of the present invention is necessarily employed as a high-side driving circuit (source follower circuit) in which the drains are mutually connected. The power MOSFET is suitable for electronic power switching circuits replacing conventional mechanical switching elements, such as driving circuits for driving lamps, for example, automotive head lamps, in addition to those for driving inductive loads such as a motor or a solenoid as in the case of FIG. 1.

To arrange a low-side driving circuit, it suffices to employ P-channel MOSFETs as output and driving MOSFETs. In this arrangement, a ground potential of the circuit is applied to the drains of the P-channel MOSFETs; therefore, it is possible to form a low-side driving circuit with a load connected to the power supply voltage (Vcc) side.

The present invention is widely applicable to semiconductor integrated circuit devices.

The following is a brief description of effects obtained by a typical one of the inventions disclosed in the present application. Namely, a semiconductor integrated circuit device is supplied with an operating voltage and/or a circuit ground potential from the outside through a unidirectional element, and the device is provided with a unidirectional element disposed to pass current from an internal ground potential point toward an input and/or output terminal and/or a unidirectional element is disposed to pass current from the input and/or output terminal toward an internal operating voltage point, whereby signals applied to the input and/or output terminal can be enlarged by the switching function of the unidirectional elements without being restricted by the level of the internal operating voltage and/or the ground potential.

While preferred embodiments along with variations and modifications have been set forth for disclosing the best mode and important details, further embodiments, variations and modifications are contemplated according to the broader aspects of the present invention, all as set forth in the spirit and scope of the following claims.

We claim:

1. A semiconductor integrated circuit device comprising:
   a voltage external terminal;
   a ground external terminal;
   an input terminal;
   an output terminal;
   an active internal circuit operatively connected electrically to all of said terminals and having an internal ground potential node and an internal operating voltage node;
   a unidirectional element electrically connected to transmit current at said internal ground potential node to said ground external terminal;
   a unidirectional element electrically connected to pass a current flowing from said internal ground potential node of said internal circuit to at least one of said input and output terminals; and
   a unidirectional element electrically connected to pass a current flowing from said internal ground potential node to the other of said input and output terminals.

2. A semiconductor integrated circuit device according to claim 1, wherein said unidirectional elements are transistors in the form of diodes.

3. A semiconductor integrated circuit device according to claim 1, including an isolation region isolating said unidirectional elements from each other and connected at said internal ground potential node.

4. A semiconductor integrated circuit device according to claim 1, and a unidirectional element electrically connected to transmit current from said voltage external terminal to said internal operating voltage node; and
   a unidirectional element electrically connected to pass a current flowing from at least one of said input and output terminals to said internal operating voltage node.

5. A semiconductor integrated circuit device according to claim 4, including a unidirectional element electrically connected to transmit a current flowing from the other of said input and output terminals to said internal operating voltage node.

6. A semiconductor integrated circuit device according to claim 5, wherein said unidirectional elements are transistors in the form of diodes.

7. A semiconductor integrated circuit device according to claim 5, including an isolation region isolating said unidirectional elements from each other and connected at said internal ground potential node.

8. A semiconductor integrated circuit device comprising:
   a voltage external terminal;
   a ground external terminal;
   an input external terminal;
   an output external terminal;
   an active internal circuit operatively connected electrically to all of said terminals and having an internal ground potential node and an internal operating voltage node;
   a unidirectional element electrically connected to transmit current from said voltage external terminal to said internal operating voltage node;
   a unidirectional element electrically connected to pass a current flowing from at least one of said input and output terminals to said internal operating voltage node; and
   means, including said unidirectional elements, for increasing the dynamic voltage range of said at least one of said input and output terminals by permitting the internal circuit operating voltage node to follow the potential at said at least one of said input and output terminals rising above the voltage applied at said voltage external terminal.

9. A semiconductor integrated circuit device comprising:
   a voltage external terminal;
   a ground external terminal;
   an input external terminal;
   an output external terminal;
   an active internal circuit operatively connected electrically to all of said terminals and having an internal ground potential node and an internal operating voltage node;
   a unidirectional element electrically connected to transmit current from said voltage external terminal to said internal operating voltage node;
   a unidirectional element electrically connected to pass a current flowing from at least one of said input and output terminals to said internal operating voltage node; and
   a unidirectional element electrically connected to transmit a current flowing from the other of said input and output terminals to said internal operating voltage node.

10. A semiconductor integrated circuit device according to claim 9, wherein said unidirectional elements are transistors in the form of diodes.

11. A high side inductive load driving circuit, to be connected between a voltage source and an inductive load, comprising:
    voltage external terminal means for connection to the voltage source;
    output terminal means for connection to the inductive load;
    input terminal means for connection to a switching input signal;
    a ground external terminal means for connection to a ground common with a low side of the inductive load; and
    active internal circuit means operatively connected to said input terminal means, said output terminal means, said voltage external terminal means and said ground external terminal means for selectively connecting said voltage source at said voltage external terminal means to a high side of said inductive load at said output terminal means in response to the switching input signal at said input terminal means, the active internal circuit means including
    a power transistor having a transistor output terminal connected to said output terminal means, a transistor terminal connected to said voltage external terminal means, and a transistor control terminal.
    a control transistor operatively connected to said input terminal means for receiving said switching input signal as a control voltage for selectively directly connecting the control terminal of said power transistor with the output terminal of said power transistor so that said switching input signal can be used to effectively control the power transistor, a semiconductor unidirectional element connected between said control transistor at a circuit ground node and said ground external terminal means to conduct current from said circuit ground node to said ground external terminal means and prevent damage to the circuit elements in the event that the supply voltage is accidentally reversely connected between said voltage external terminal means and said ground external terminal means, and a semiconductor unidirectional element connected between said circuit ground node and the output terminal of said power transistor for conducting current from said circuit ground node to said output terminal of said power transistor for permitting the circuit ground potential to drop below the ground potential at said external ground terminal means when counter electromotive force is generated at said output terminal means, due to said power transistor turning off the power to said inductive load, for correspondingly reducing the voltage below external ground at the control terminal of said power transistor to prevent clamping of voltage at the output terminal means in the internal circuit so that the turning off of the power transistor is guaranteed, thereby increasing the external voltage range of said output terminal means.

12. The circuit according to claim 11, wherein each of said transistors is a MOSFET.

13. The circuit according to claim 12, constructed entirely as an integrated circuit on a single substrate, with the drain of said power transistor being the substrate and the voltage external terminal means being directly connected to said substrate.

14. The circuit according to claim 11, providing a boost voltage means between said transistor terminal of said power transistor and said control terminal of said power transistor, for supplying an added control voltage of a value at least substantially greater than the threshold voltage of said power transistor, so that the voltage at said output terminal means will not be substantially reduced from the voltage source at said voltage external terminal means.

15. The circuit according to claim 12, including an external ground connected to said ground external terminal means and an inductive load operatively connected between said external ground and said output terminal means; and a positive supply voltage connected to said voltage external terminal means.

16. The circuit according to claim 15, further including a voltage clamping circuit connected across said inductive load for clamping the counter electromotive voltage from said inductive load when said power transistor is turned off, with the counter electromotive voltage thereby being clamped across the gate to source of said power transistor for proportionally decreasing the turn off time of said power transistor.

17. The circuit according to claim 16, wherein said clamping circuit includes a diode connected to transmit current from ground to said output terminal means in series with an oppositely connected zener diode, so that the clamping voltage will be the threshold voltage of said diode and the zener voltage of said zener diode, so that the external energy of the inductive load is used to increase the switching speed of the power transistor.

18. An input circuit, comprising:
voltage external terminal means for connection to a voltage source;
output terminal means for connection to a load;
input terminal means for connection to an input signal;
ground external terminal means for connection to a ground external of the circuit;
active internal circuit means operatively connected to said input terminal means, said voltage external terminal means, said ground external terminal means and said output terminal means, and including an input transistor having a control terminal directly connected to said input terminal means;
a unidirectional device electrically connected between the output terminal of said transistor and said ground external terminal means for conducting current toward said ground external terminal means and establishing a circuit internal ground node at said output terminal of said transistor;
a second unidirectional device operatively connected between said internal circuit ground node and said transistor control terminal for conducting current only from said internal circuit ground node to said transistor control terminal; and
said unidirectional devices together comprising means to enlarge the input dynamic range of an input signal applied to said input terminal means to below the external ground potential without voltage clamping said input signal at the input terminal means and thereby lowering the internal ground node lower than the external ground applied at said external ground terminal means.

19. A semiconductor integrated circuit device, comprising:
a voltage external terminal;
a ground external terminal;
an input external terminal;
an output external terminal;
an active internal circuit operatively connected electrically to all of said terminals and having an internal ground potential node and an internal operating voltage node;
a unidirectional element electrically connected to transmit current at said internal ground potential node to said ground external terminal;
a unidirectional element electrically connected to pass a current flowing from said internal ground potential node of said internal circuit to at least one of said input and output terminals; and means, including said unidirectional elements, for increasing the dynamic voltage range of said at least one of said input and output terminals by permitting the internal circuit ground potential node to follow the potential at said at least one of said input and output terminals dropping below ground potential applied at said ground external terminal.

20. The circuit according to claim 11, wherein said unidirectional elements are the emitter to base terminals of respective sense transistors; and further said sense transistors being means for flowing sense current between the collector and emitter of said unidirectional elements so that the sense current determines relative voltage values of said emitter to base terminals.

21. The circuit according to claim 11, integrated on a single semiconductor chip, and said circuit further including additional active components having a separate second independent internal ground node connected to said external ground terminal means through an additional unidirectional element, so that the second internal circuit ground node potential does not follow a negative swing of voltage at said at least one input and output terminals.

22. The circuit according to claim 11, completely formed as an integrated circuit on a single substrate;
said power transistor being a MOSFET in source follower configuration;
said substrate being N-type, forming the drain region of aid power MOSFET and being directly connected to said voltage external terminal means;
a P-type region formed within said substrate as the channel region of said power MOSFET, and an N-type source region being formed with said P-type channel region;
a P-type isolation region being formed within said substrate and spaced from said power MOSFET;
N and P-type regions being formed within said isolation region for constituting said unidirectional elements;
a large parasitic diode being formed between said P-type isolation region and said N-type substrate; and
said P-type isolation region being connected to said external ground terminal means only through said unidirectional element formed within said P-type isolation region so that reversal of power and ground supply will not produce a high flow of current through said parasitic diode.

23. The circuit according to claim 22, wherein said circuit ground node is connected directly to said isolation P-type region.

24. The circuit according to claim 22, including
a further isolation region of N-type within said P-type isolation region and having therein active circuit elements formed; and
said P-type isolation region and N-type isolation regions being directly connected together at internal circuit ground potential thereby preventing the formation of a parasitic transistor between said N-type substrate, P-type isolation region and N-type isolation region.

25. A circuit for providing high side driving of an inductive load, comprising:
output terminal means for connection to the high voltage side of an inductive load;
input circuit means providing a control voltage input signal in active on, inactive off form;
supply voltage input terminal means for connection to an external supply voltage;
ground terminal means for connection to an external ground;
a power MOSFET having its drain connected to said supply voltage input terminal means and its source connected to said output terminal means, and having a gate;
first unidirectional means connected between said ground terminal means and an internal ground node, connected to transmit current from the internal ground node to the ground terminal means;
second unidirectional means connected between said internal ground node and said power MOSFET source, connected to transmit current from said internal ground node to said power MOSFET source and said output terminal means;
first control transistor means connected across said gate and source of said power MOSFET and having a control terminal, and operatively connected to providing sufficient voltage for said power MOSFET gate to turn on when said first control transistor means is turned off and reducing the voltage at the power MOSFET gate sufficiently to turn off said power MOSFET when said first control transistor means is on;
second control transistor means operatively connected between said internal ground node and said power MOSFET gate and having a control terminal for turning on and thereby turning off said power MOSFET and thereby sufficiently reducing the voltage at the source of said power MOSFET that said first control transistor means can turn on in response to said input signal;
said input circuit means supplying the input signal to the control terminal of each of said first and second control transistor means at a voltage substantially lower than the source voltage of said power MOSFET when said power MOSFET is on;
said input circuit means providing a high pulse signal as the active input signal for turning on said first and second control transistor means and selectively providing a low signal as the inactive input signal for turning off said second control transistor means with a stair step ramp;
third unidirectional means electrically connected between the gate of said power MOSFET and said second control transistor means for preventing feed of said pulse signal to the gate of said power MOSFET; and
said first control transistor means being parallel connected to said second unidirectional means, said second control transistor means and said third unidirectional means.

26. The circuit according to claim 25, completely formed as an integrated circuit on a single substrate except for said input circuit means.

27. The circuit according to claim 26, further including a zener diode between the output terminal means and the control terminal of said first control transistor means and a zener diode between the output terminal means and the control terminal of said second control transistor means for preventing destruction of said first and second control transistor means by the breakdown voltage of the zener diodes in the event that a turning off of the inductive load would pull the output terminal means voltage far below ground.

28. The circuit according to claim 27, diode means operatively between the control terminal of said first control transistor means and said input circuit means for preventing high voltage at said output terminal means from feeding current back.

29. The circuit according to claim 28, further including a resistor connected in parallel across said zener diode of said first control transistor means for providing drain of control terminal voltage when said first control transistor means is turned off.

30. The circuit according to claim 25, further including a zener diode between the output terminal means and the control terminal of said first control transistor means and a zener diode between the output terminal means and the control terminal of said second control transistor means for preventing destruction of said first and second control transistor means by the breakdown voltage of the zener diodes in the event that a turning off of the inductive load would pull the output terminal means voltage far below ground.

31. A high side load driving circuit, to be connected between a voltage source and a load, comprising:
voltage external terminal means for connection to the voltage source;
output terminal means for connection to the load;
input terminal means for connection to a switching input signal;
a ground external terminal means for connection to a ground common with the low side of the load;
active internal circuit means operatively connected to said input terminal means, said output terminal means, said voltage external terminal means and said ground external terminal means for selectively connecting said voltage source at said voltage external terminal means to a high side of said load at said output terminal means in response to the switching input signal at said input terminal means, and having a power switching device having a switch output terminal connected to said output terminal means, a switch terminal connected to said voltage external terminal means, and a switch control terminal;
a control device operatively connected to said input terminal means for receiving said switching input signal as a control voltage for selectively directly connecting the switch control terminal of said power switching device with the switch output terminal of said power switching device so that said switching input signal can be used to effectively control the power switching device;
a semiconductor unidirectional element connected between a circuit ground node and said ground external terminal means to conduct current from said circuit ground node to said ground external terminal means;
a semiconductor unidirectional element connected between said circuit ground node and the switch output terminal of said power switching device for conducting current from said circuit ground node to said switch output terminal of said power switching device; and
means, including said semiconductor unidirectional elements, for increasing the dynamic voltage range of said output terminal means by permitting the circuit ground node to follow the potential at said output terminal means dropping below ground potential applied at said ground external terminal means.

32. The circuit according to claim 31, wherein said switching device is a source follower power MOSFET.

33. The circuit according to claim 32, constructed entirely as an integrated circuit on a single substrate, with the drain of said power MOSFET being the substrate and the voltage external terminal means being directly connected to said substrate.

34. An integrated driving circuit having a first external terminal for receiving a first supply voltage, a second external terminal for receiving a second supply voltage lower than the first supply voltage, a third external terminal for receiving an externally generated input signal and a fourth external terminal for providing an internally generated output signal, the integrated driving circuit being for use with
an inductive load coupled to the fourth external terminal to receive the internally generated output signal and coupled to receive the second supply voltage, the inductive load generating counter electromotive force therein when an operation state of the inductive load is changed from an on-state to an off-state in response to the internally generated output signal, and
means coupled to the fourth external terminal for releasing energy of the counter electromotive force in the inductive load when the operation state of the inductive load is changed from the on-state to the off-state,
the integrated driving circuit comprising:
a power MOSFET having a source-drain path coupled between the first and fourth external terminals and a gate;
a control circuit coupled to the third external terminal and the gate of the power MOSFET for driving the power MOSFET in response to the externally generated input signal, the control circuit having a first node coupled to the first external terminal and a second node;
first diode means, coupled between the second external terminal and the second node, for transmitting a current from the second node to the second external terminal when the first diode means is turned on; and
second diode means, coupled between the second node and the fourth external terminal, for transmitting a current from the second node to the fourth external terminal when the second diode means is turned on.

35. The integrated driving circuit according to claim 34, wherein the power MOSFET is of an n-channel, wherein the second supply voltages is at a ground potential, and wherein a potential on the fourth external terminal becomes a negative potential lower than the ground potential when the counter electromotive force is generated.

36. A switching system comprising:
an integrated driving circuit including:
a first external terminal for receiving a first supply voltage;
a second external terminal for receiving a second supply voltage lower than the first supply voltage;
a third external terminal for receiving an input signal;
a fourth external terminal for providing an output signal;
a power MOSFET coupled to have a source-drain path coupled between the first and fourth external terminals and a gate;
a control circuit coupled to the third external terminal and the gate of the power MOSFET for driving the power MOSFET in response to the input signal, the control circuit having a first node coupled to the first external terminal and a second node;
first diode means, coupled between the second external terminal and the second node, for transmitting a current from the second node to the second external terminal when the first diode means is turned on, and
second diode means, coupled between the second node and the fourth external terminal, for transmitting a current from the second node to the fourth external terminal when the second diode means is turned on,
an inductive load coupled to the fourth external terminal for receiving the output signal and coupled to receive the second supply voltage, the inductive load generating counter electromotive force therein when an operation state of the inductive load is changed from an on-state to an off-state in response to the output signal; and means coupled to the fourth external terminal for releasing energy of the counter electromotive force in the inductive load when the operation state of the inductive load is changed from the on-state to the off-state.

37. The switching system according to claim 36, wherein the power MOSFET is of an n-channel, wherein the second supply voltage is at a ground potential, and wherein a potential on the fourth external terminal becomes a negative potential lower than the ground potential when the counter electromotive force is generated.

38. The switching system according to claim 36, wherein the inductive load includes one of a motor and a solenoid.

39. The switching system according to claim 36, wherein the inductive load includes a solenoid employed for an electronic fuel injection in an automobile.

40. The circuit according to claim 1, further comprising means, including said unidirectional elements, for increasing the dynamic voltage range of said at least one of said input and output terminals by permitting the internal circuit ground potential node to follow the potential at said at least one of said input and output terminals dropping below ground potential applied at said ground external terminal.

41. A circuit for providing high side driving of an inductive load, comprising:

output terminal means for connection to the high voltage side of an inductive load;

input circuit means providing a control voltage input signal in active on, inactive off form;

supply voltage input terminal means for connection to an external supply voltage;

ground terminal means for connection to an external ground;

a power MOSFET having its drain connected to said supply voltage input terminal means and its source connected to said output terminal means, and having a gate;

first unidirectional means connected between said ground terminal means and an internal ground node, connected to transmit current from the internal ground node to the ground terminal means;

first control transistor means connected across said gate and source of said power MOSFET and having a control terminal, and operatively connected for providing sufficient voltage for said power MOSFET gate to turn on when said first control transistor means is turned off and reducing the voltage at the power MOSFET gate sufficiently to turn off said power MOSFET when said first control transistor means is on;

second control transistor means operatively connected between said internal ground node and said power MOSFET gate and having a control terminal and for turning on and thereby turning off said power MOSFET and thereby sufficiently reducing the voltage at the source of said power MOSFET that said first control transistor means can turn on in response to said input signal;

said input circuit means supplying the input signal to the control terminal of each of said first and second control transistor means at a voltage substantially lower than the source voltage of said power MOSFET when said power MOSFET is on;

said input circuit means providing a high pulse signal as the active input signal for turning on said first and second control transistor means and selectively providing a low signal as the inactive input signal for turning off said second control transistor means with a stair step ramp;

second unidirectional means electrically connected between the gate of said power MOSFET and said second control transistor means for preventing feed of said pulse signal to the gate of said power MOSFET; and said first control transistor means being parallel connected to said second control transistor means and said second unidirectional means.

42. The circuit according to claim 41, completely formed as an integrated circuit on a single substrate except for said input circuit means.

43. The circuit according to claim 42, further including a zener diode between the output terminal means and the control terminal of said first control transistor means and a zener diode between the output terminal means and the control terminal of said second control transistor means for preventing destruction of said first and second control transistor means by the breakdown voltage of the zener diodes in the event that a turning off of the inductive load would pull the output terminal means voltage far below ground.

44. The circuit according to claim 43, diode means operatively between the control terminal of said first control transistor means and said input circuit means for preventing high voltage at said input circuit means from feeding current back.

45. The circuit according to claim 44, further including a resistor connected in parallel across said zener diode of said first control transistor means for providing drain of control terminal voltage when said first control transistor means is turned off.

46. The circuit according to claim 41, further including a zener diode between the output terminal means and the control terminal of said first control transistor means and a zener diode between the output terminal means and the control terminal of said second control transistor means for preventing destruction of said first and second control transistor means by the breakdown voltage of the zener diodes in the event that a turning off of the inductive load would pull the output terminal means voltage far below ground.

47. A semiconductor integrated circuit device for driving an inductive load, the semiconductor integrated circuit device, comprising the following elements:

a semiconductor substrate;

a first terminal for receiving a first supply voltage;

a second terminal for receiving a second supply voltage lower than the first supply voltage;

an input terminal for receiving an input signal;

an output terminal to which the inductive load is to be coupled;

an output transistor having an on state and an off state and a control terminal, the output transistor having a current path coupled between the first terminal and the output terminal so that the inductive load generates counter electromotive force therein when an operation state of the output transistor changes from the on state to the off state;

a control circuit coupled to the input terminal and responsive to the input signal on the input terminal for providing a driving signal to the control terminal of the output transistor, and the control circuit further having a first node coupled to the first terminal and a second node;

first means for coupling the second node to the second terminal when the first and second terminals receive the first and second supply voltages, respectively, and uncoupling the second node to the second terminal when the first and second terminals receive the second the first supply voltages, respectively;

second means coupled to the output terminal for feeding a voltage on the output terminal to the control terminal of the output transistor when the inductive load is generating the counter electromotive force therein, and for thereby maintaining a voltage across the output terminal and the control terminal of the output transistor sufficient for maintaining the off state of the output transistor during the generation of the counter electromotive force by the load;

said first and second means increasing the dynamic voltage range of said output terminal by permitting the control terminal to follow the potential at the output terminal dropping below the second supply voltage at the second terminal; and all of the elements being formed on the semiconductor substrate.

48. The semiconductor integrated circuit device according to claim 47, wherein the output transistor is an N channel power MOSFET, wherein the current path of the output transistor is a source-drain path of the power MOSFET, and wherein the control terminal of the output transistor is a gate of the power MOSFET.

49. The semiconductor integrated circuit device according to claim 48, wherein the first means is a diode.

50. The semiconductor integrated circuit device according to claim 49, wherein the semiconductor substrate includes an isolation region in which the diode is formed, and wherein the second node is constructed of the isolation region.

51. The semiconductor integrated circuit device according to claim 48, wherein the second means is a diode.

52. The semiconductor integrated circuit device according to claim 48, wherein the first means is a first diode, and wherein the second means is a second diode.

53. The semiconductor integrated circuit device, according to claim 52, wherein the semiconductor substrate includes an isolation region in which the first and second diodes are formed in isolation from each other, and wherein the second node is constructed of the isolation region.

54. A semiconductor integrated circuit device, comprising:

a semiconductor substrate;

a first terminal for receiving a first supply voltage;

a second terminal for receiving a second supply voltage lower than the first supply voltage;

an input terminal for receiving an input signal;

an output terminal to which an inductive load is to be coupled;

an internal active circuit coupled to the input terminal and responsive to the input signal on the input terminal for providing an output signal to the output terminal, the internal active circuit further having an output transistor with a control terminal, a first node coupled to the first terminal and a second node;

means for coupling the second node to the second terminal when the first and second terminals receive the first and second supply voltages, respectively, uncoupling the second node to the second terminal when the first and second terminals receive the second and first supply voltages, respectively, and increasing the dynamic voltage range of said control terminal by permitting the control terminal to follow the potential at the output terminal dropping below the second supply voltage at said second terminal; and the semiconductor substrate including an isolation region in which the means for coupling is formed; and wherein the second node is constructed of the isolation region; and all of the elements being on the one semiconductor substrate.

55. The semiconductor integrated circuit device according to claim 54, further including:

second means coupled to the output terminal for feeding a voltage on the output terminal to the control terminal of the output transistor when the inductive load is generating a counter electromotive force therein, so that the off state of the output transistor continues for the generation of the counter electromotive force.

* * * * *